(12) United States Patent
Deak

(10) Patent No.: US 9,702,943 B2
(45) Date of Patent: Jul. 11, 2017

(54) SINGLE CHIP PUSH-PULL BRIDGE-TYPE MAGNETIC FIELD SENSOR

(71) Applicant: MultiDimension Technology Co., Ltd., Zhangjiagang (CN)

(72) Inventor: James Geza Deak, Zhangjiagang (CN)

(73) Assignee: Multidimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 14/908,770

(22) PCT Filed: Jul. 29, 2014

(86) PCT No.: PCT/CN2014/083241
§ 371 (c)(1),
(2) Date: Jan. 29, 2016

(87) PCT Pub. No.: WO2015/014277
PCT Pub. Date: May 2, 2015

(65) Prior Publication Data
US 2016/0169982 A1 Jun. 16, 2016

(30) Foreign Application Priority Data
Jul. 30, 2013 (CN) .......................... 2013 1 0325337

(51) Int. Cl.
*G01R 33/00* (2006.01)
*G01R 33/09* (2006.01)

(52) U.S. Cl.
CPC .......... *G01R 33/0011* (2013.01); *G01R 33/09* (2013.01); *G01R 33/096* (2013.01)

(58) Field of Classification Search
CPC ... G01R 33/09–33/098; G01R 33/0011; G01D 5/12–5/2525
See application file for complete search history.

(56) References Cited

U.S. PATENT DOCUMENTS

2005/0030018 A1* 2/2005 Shibahara .............. G01R 15/20
                                                                    324/251
2005/0280411 A1 12/2005 Bicking
(Continued)

FOREIGN PATENT DOCUMENTS

CN          103116144          1/2013
CN          103412269          11/2013
(Continued)

OTHER PUBLICATIONS

"International Application No. PCT/CN2014/083241, International Search Report and Written Opinion mailed Oct. 13, 2014", (Oct. 13, 2014), 12 pgs.

*Primary Examiner* — Huy Q Phan
*Assistant Examiner* — David Frederiksen
(74) *Attorney, Agent, or Firm* — Schwegman Lundberg & Woessner, P.A.

(57) ABSTRACT

A single chip push-pull bridge-type magnetic field sensor. The sensor comprises a substrate, bonding pads, magnetoresistance sensing elements, and flux concentrators, wherein the magnetoresistance sensing elements are positioned in the clearances of the adjacent flux concentrators, and the directions of the pinning layers of the magnetoresistance sensing elements are identical. The flux concentrators are divided into a push arm type and a pull arm type, the included angle between one type and an X-axis forward direction is positive, and the included angle between the other type and the X-axis forward direction is negative. The working principle of the sensor is that the magnetic field along the X-axis direction in the clearances of the flux concentrators are oppositely oriented. The sensor has the advantages of small size, low cost, simplicity in manufacturing, high sensitivity, good linearity, high sensitivity, wide working dynamic range, and the like.

10 Claims, 7 Drawing Sheets

(56) References Cited

U.S. PATENT DOCUMENTS

| | | | | |
|---|---|---|---|---|
| 2010/0231211 A1* | 9/2010 | Edelstein | ............... | G01D 1/00 |
| | | | | 324/244 |
| 2013/0141090 A1 | 6/2013 | Sidman | | |
| 2013/0207650 A1* | 8/2013 | Koop | ...................... | H05K 1/18 |
| | | | | 324/251 |
| 2013/0221949 A1* | 8/2013 | Liu | ................... | G01R 33/0011 |
| | | | | 324/202 |
| 2013/0253864 A1* | 9/2013 | Fujita | ............... | G01R 33/0005 |
| | | | | 702/65 |
| 2015/0177337 A1* | 6/2015 | Yamashita | .............. | H01L 43/08 |
| | | | | 324/252 |

FOREIGN PATENT DOCUMENTS

| | | |
|---|---|---|
| CN | 103592608 | 2/2014 |
| CN | 103630855 | 3/2014 |
| CN | 203587785 | 5/2014 |
| CN | 203587786 | 5/2014 |
| CN | 203658562 | 6/2014 |
| CN | 103954920 | 7/2014 |
| CN | 203811787 | 9/2014 |
| WO | WO-2015014277 | 2/2015 |

\* cited by examiner

—PRIOR ART—

SINGLE CHIP PUSH-PULL BRIDGE-TYPE MAGNETIC FIELD SENSOR

PRIORITY CLAIM TO RELATED APPLICATIONS

This application is a U.S. national stage application filed under 35 U.S.C. §371 from International Application Serial No. PCT/CN2014/083241, which was filed 29 Jul. 2014, and published as WO2015/014277 on 5 Feb. 2015, and which claims priority to Chinese Application No. 201310325337.5, filed 30 Jul. 2013, which applications and publication are incorporated by reference as if reproduced herein and made a part hereof in their entirety, and the benefit of priority of each of which is claimed herein.

TECHNICAL FIELD

The present invention relates to the field of sensor technologies, and in particular, to a single chip push-pull bridge-type magnetic field sensor.

BACKGROUND ART

A TMR (Tunneling MagnetoResistance) sensor is a new magnetoresistance effect sensor that has begun to be applied to the industry field in recent years. The sensor utilizes the tunnel magnetoresistance effect of a magnetic multilayer film material to sense a magnetic field, which is mainly manifested in: in a magnetic multilayer film material, wherein the resistance of a magnetic multilayer film changes, as the magnitude and direction of an external magnetic field changes. It has a greater magnetoresistance than existing AMR (Anisotropic MagnetoResistance) and GMR (Giant MagnetoResistance) sensors, and it also has better temperature stability than Hall sensors.

Common TMR or GMR push-pull bridge-type sensors require that the magnetization directions of pinning layers of the magnetoresistance sensing elements in two adjacent bridge arm resistors should be oppositely oriented, while, generally for TMR or GMR elements deposited on the same substrate, since the magnitude and direction of the magnetic field are the same, and the magnetization directions of pinning layers of magnetoresistance sensing elements on the same substrate are the same, it is difficult to manufacture a push-pull bridge-type sensor. At present, there are several methods used for manufacturing a push-pull bridge-type sensor on a single chip.

(1) Magnetization directions of pinning layers of magnetoresistance sensing elements in the arm are set in opposite directions by using a two-step film forming process or by local laser assisted magnetic annealing, so as to achieve a single chip bridge-type sensor. The two-step film forming process for depositing the TMR elements, such that the pinning layers are in opposite directions, in two steps respectively. This makes the fabrication process complicated, and a thin film deposited in the first step may be affected during a second annealing process. This makes consistency of the films formed in the two steps poor, thereby affecting the overall performance of the sensor. The local laser heating magnetic annealing method refers to, after initially annealing in the same strong magnetic field, the chip is then local laser annealed, to set the magnetization directions of pinning layers of adjacent arms in opposite directions, thereby achieving a single chip bridge-type sensor. However, this method requires dedicated custom fabrication device which is expensive, and the whole process is time-consuming.

(2) The single chip bridge-type sensor is achieved by tilting the magnetic moment directions of free layers of the magnetoresistance sensing elements in the bridge arms. That is, the magnetization directions of the pinning layers of the magnetoresistance sensing elements within each bridge arm are the same, but the magnetization directions of the free layers of the magnetoresistance sensing elements in adjacent bridge arms are different, but the absolute angle between the magnetization direction of the free layer of each of the magnetoresistance sensing elements and the magnetization directions of its pinning layers is the same. A problem with this method is a reduction of the response of the sensor to the magnetic field, thereby leading to reduction of the sensitivity of the sensor.

(3) Multi-chip packaging technology: two well matched magnetoresistors taken from the same wafer or different wafers, where magnetization directions of pinning layers of the two magnetoresistors are the same, and then in a multi-chip packaging process one of them is rotated by 180 degrees relative to the other magnetoresistor, in order to form a push-pull half bridge. The method can achieve the function of a push-pull type half bridge, that is, the method increases the detection sensitivity and has a temperature compensation function, however, on the other hand, a multi-chip package has a large packaging size and a high production cost. Moreover in actual practice, it is not possible to accurately flip a chip by 180° in the package. As a result, the sensitivity directions of the two resistors are not exactly aligned 180 degrees with respect to each other, and this causes output characteristics of the two resistors to change differently with applied magnetic field. As a result of this asymmetry in sensitivity, there is a greater offset voltage, which may be problematic in many real-world applications.

In addition, the push-pull bridge-type sensor has higher sensitivity than a single-resistor reference bridge-type sensor, it has better temperature compensation, and therefore it can reduce the effect of temperature drift. Prior art push-pull bridge-type magnetic field sensors use a permanent magnet to bias the magnetization directions of the magnetoresistance elements, and the sensor has a higher cost and greater offset, and it is not suitable for high-intensity magnetic fields.

SUMMARY OF THE INVENTION

An objective of the present invention is to provide a single chip push-pull bridge-type magnetic field sensor with small size, low cost, high sensitivity, good linearity, and simplicity in manufacturing, so as to overcome the above problems existing in the prior art.

In order to achieve the foregoing technical objective and achieve the foregoing technical effect, the present invention is implemented through the following technical scheme:

A single chip push-pull bridge-type magnetic field sensor, wherein the sensor includes: a substrate in an XY plane, at least one push arm consisting of one or more magnetoresistance sensing elements, and at least one pull arm consisting of one or more magnetoresistance sensing elements, multiple push arm flux concentrators and pull arm flux concentrators disposed on the substrate, wherein certain clearances are provided between every two of the multiple push arm flux concentrators and between every two of the multiple pull arm flux concentrators. The XY plane is defined by coordinate axes, an X axis and a Y axis. An included angle between the push arm flux concentrators and an X-axis forward direction is positive while an included angle between the pull arm flux concentrators and the X-axis forward direction is negative, or an included angle between the push arm flux concentrators and an X-axis forward direction is negative while an included angle between the pull arm flux concentrators and the X-axis forward direction is positive. Magnetization directions of magnetic pinning layers of the magnetoresistance sensing elements are identical; the magnetoresistance sensing elements are respectively located at the clearances between two adjacent push arm flux concentrators or two adjacent pull arm flux concentrators correspondingly, to detect different oppositely oriented X-axis components of the magnetic fields between the push arm flux concentrators and the pull arm flux concentrators; and the magnetoresistance sensing elements form a push-pull bridge through a typical electrical interconnection method used within semiconductor packaging, additionally used to form input and output connections.

Preferably, the magnetoresistance sensing elements are GMR or TMR sensing elements.

Preferably, in the absence of an external magnetic field, the free layer magnetization directions of magnetoresistance sensing elements are perpendicular to the magnetization directions of the magnetic pinning layers which is achieved using permanent magnet biasing, double exchange interaction, shape anisotropy, or any combination thereof.

Preferably, the number of the magnetoresistance sensing elements in the push arm and the pull arm are the same and the magnetoresistance sensing elements in relative positions of the push arm and the pull arm are parallel to each other.

Preferably, rotational angles of the magnetoresistance sensing elements on the push arm and the pull arm are at the same magnitude but opposite polarity.

Preferably, the included angle between the push arm flux concentrators and the X-axis forward direction is 5° to 85°, and the included angle between the pull arm flux concentrators and the X-axis forward direction is −5° to −85°.

Preferably, the push-pull bridge is a half bridge, a full bridge or a quasi bridge.

Preferably, both the push arm flux concentrators and the pull arm flux concentrators are arrays or narrow bars, which are made of a material selected from a soft ferromagnetic alloy consisting of one or more elements of Ni, Fe, Co and Al.

Preferably, the number of the push arm flux concentrators and the number of the pull arm flux concentrators are the same.

Preferably, the microelectronic connection and packaging method includes bonding pads, a lead frame, flip chip, ball grid array, wafer level packaging, or chip on board direct mounting.

Compared with the prior art, the present invention has the following beneficial effects:

(1) The magnetization directions of the pinning layers of the magnetoresistance sensing elements in bridge arms of the bridge are identical, and thus manufacturing on a single chip can be achieved without using a process such as two-step film forming or annealing.

(2) Use of multiple elongated flux concentrators enables sensors to have good linearity and high sensitivity and also enables the output of the sensor more difficult to saturate, thereby increasing a working dynamic range of the sensor, and in addition, more magnetoresistance sensing elements can be placed at the clearances of the elongated flux concentrators, thereby reducing noise.

(3) Compared with the push-pull bridge-type magnetic sensor in the prior art, the push-pull bridge-type magnetic field sensor in the present invention uses flux concentrators instead of a permanent magnet, thus the cost is lower, moreover, the push-pull bridge-type magnetic field sensor of the design does not need to rotate in different directions and thus is much easier for matching of bridge arms, thereby rendering smaller offset, and in addition, since the size of the magnetoresistance sensing elements used is very small (for example, 0.1×10 μm), the design is more suitable for high-intensity magnetic fields.

(4) With respect to existing referenced bridge-type magnetic field sensors, the push-pull bridge-type magnetic field sensor of the present invention has better linearity, higher sensitivity, and wider working dynamic range.

BRIEF DESCRIPTION OF THE DRAWINGS

In order to more clearly illustrate the technical solutions used in the technical embodiments of the present invention, the accompanying drawings to be used for describing the technical embodiments of the present invention are introduced briefly in the following. Obviously, the accompanying drawings in the following description are only some of the possible embodiments of the present invention, and persons of ordinary skill in the art can devise other drawings without any creative effort which do not deviate from the spirit of the present invention.

DETAILED DESCRIPTION OF THE PREFERRED EMBODIMENTS

Figure 1:
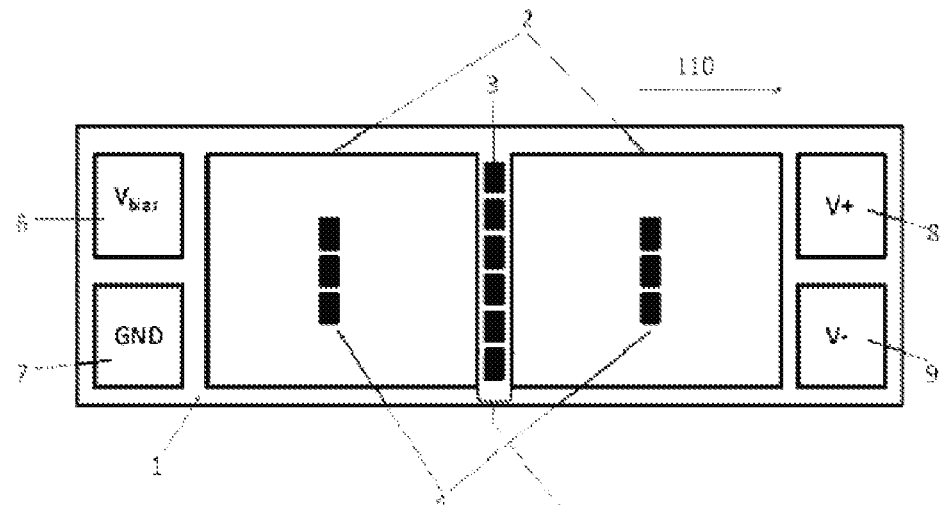
FIG. 1 is a schematic structural view of a single chip bridge-type magnetic field sensor in the prior art.

FIG. 1 is a schematic structural view of a single chip bridge-type magnetic field sensor in the prior art. The structure includes a substrate 1, two shielding layers 2, a sensing element 3 and a reference element 4, and the two shielding layers 2 have a clearance 5 therebetween. Four bonding pads 6-9 for input and output are respectively used as a power supply end Vbias, a ground end GND and voltage output ends V+ and V− in sequence, and their sensing axis direction is 110. The reference element 4 is located below the shielding layers 2, the sensing element 3 is located at the clearance 5 between the two shielding layers 2, and the shape of the shielding layers 2 is square. The sensing element 3 is connected to form a sensing arm, and the reference element 4 is connected to form a reference arm. The substrate 1 has a very large length along the sensing axis direction 110, and the sensing element 3 and the reference element 4 are far apart from each other, that is, the spacing between the sensing arm and the reference arm is larger, and they only have one clearance 5 therebetween, which may result in a waste of space on the chip and cause the size of the chip to be larger, and the size of the chip designed is about 2 mm×0.5 mm. Moreover, since the spacing between the sensing arm and the reference arm is larger, it may be difficult to balance the bridge, and temperatures on the two arms may be different, thereby leading to reduction of the temperature compensation function thereof. In addition, owing to use of the square shielding layers 2, it may be much easier to cause the sensor to reach a saturated state of the magnetic field, generation of a non-uniform saturated magnetic field may begin near the center of the shielding layers 2, and hysteresis will be generated in the vicinity of the clearance 5, thereby reducing linearity of the sensor.

The method of solving the foregoing problems is also present in the prior art, but is not very perfect. For example, Chinese Patent Application 201310203311.3 discloses a single chip reference bridge-type magnetic field sensor, wherein the sensor includes a reference element string and a sensing element string arranged in a staggered manner and an elongated shielding structure, the reference element string is located below the shielding structure, and the sensing element string is located at a clearance between two shielding structures. Although the sensor with such a structure can solve the foregoing problems, compared with the present invention, its linearity is not good enough, detected signals are not strong enough, and it is very difficult to control its offset.

SUMMARY OF THE INVENTION of the present invention is further described below with reference to the accompanying drawings and embodiments.

Embodiment 1

Figure 2:
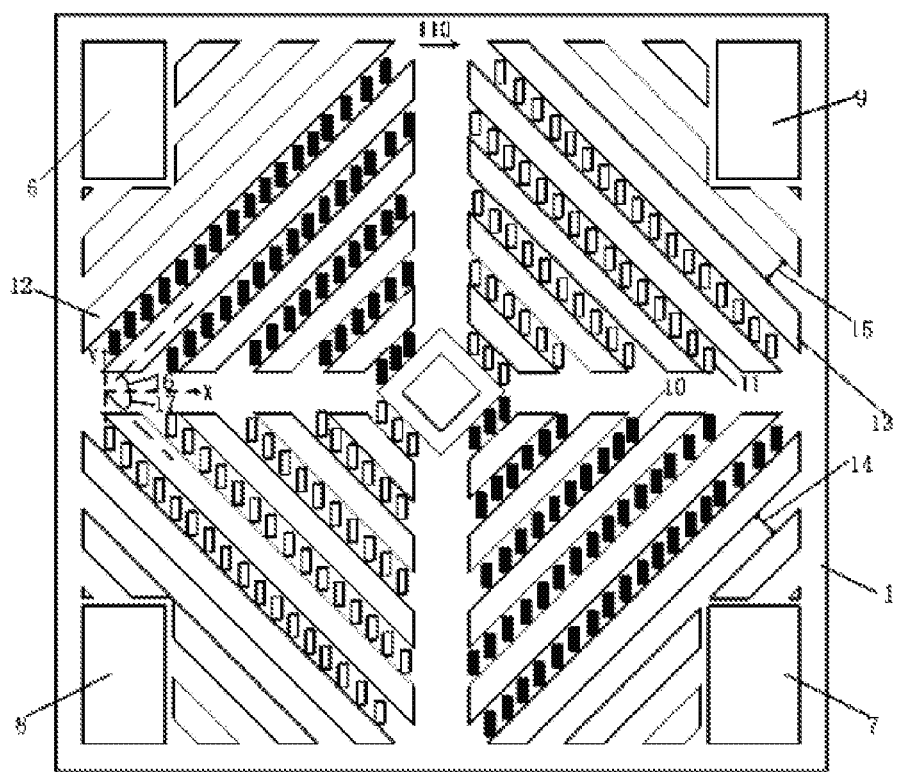
FIG. 2 is a schematic structural view of a single chip push-pull full-bridge magnetic field sensor according to the present invention.

FIG. 2 is a schematic structural view of a single chip push-pull full-bridge magnetic field sensor according to the present invention. The sensor includes a substrate 1, bonding pads 6-9 for input and output, multiple push arm flux concentrations 12 and pull arm flux concentrates 13 obliquely disposed on the substrate 1, and magnetoresistance sensing elements 10 and 11 respectively located at a clearance 14 between two adjacent push arm flux concentrations and a clearance 15 between two adjacent pull arm flux concentrates. The magnetoresistance sensing elements 10 and 11 are GMR or TMR magnetoresistance sensing elements, the shape thereof may be square, diamond-shaped or elliptic, the number of the magnetoresistance sensing elements 10 and the number of the magnetoresistance sensing elements 11 are the same and the magnetoresistance sensing elements 10 and 11 corresponding to each other are parallel to each other, and magnetization directions of magnetic pinning layers of the magnetoresistance sensing elements are the same, both of which are 110. In the absence of an external magnetic field, the magnetoresistance sensing elements 10 and 11 make magnetization directions of magnetic free layers perpendicular to the magnetization directions of the magnetic pinning layers through permanent magnet biasing, double exchange interaction, shape anisotropy or any combination thereof, for detecting a difference value of components of magnetic fields between the push arm flux concentrators and the pull arm flux concentrators in the direction of the X axis. The magnetoresistance sensing elements 10 and 11 are electrically connected with the bonding pads 6-9 to form a full bridge, and the full bridge includes two push arms and two pull arms, wherein bridge arms formed by the magnetoresistance sensing elements 10 are push arms, and bridge arms formed by the magnetoresistance sensing elements 11 are pull arms. The push arm flux concentrators 12 and the pull arm flux concentrators 13 are elongated arrays, which are made of a material selected from a soft ferromagnetic alloy consisting of one or more elements of Ni, Fe, Co and Al, but are not limited thereto. An included angle between the push arm flux concentrators 12 and an X-axis forward direction is 16, and preferably, a value thereof ranges from 5° to 85°, which is 45° in this embodiment; an included angle 17 between the pull arm flux concentrators 13 and the X-axis forward direction ranges from −5° to −85°, which is −45° in this embodiment. Preferably, the size of the chip of the present invention is 0.5 mm×0.5 mm. In addition, in accordance with different application demands, the size of the chip may also be less than 0.5 mm×0.5 mm. In this embodiment, the size of the clearances 14 and 15 is 20 μm, both the push arm flux concentrators 12 and the pull arm flux concentrators 13 have a width of 20 μm and a thickness of 10 μm, and the size of the magnetoresistance sensing elements (10, 11) is 15 μm×1.5 μm.

In this embodiment, bonding pads are used to make input and output connections, and it is also feasible to use a microelectronics connection and packaging method such as flip chip, ball grid array, wafer level packaging and chip on board direct mounting.

Figure 3:
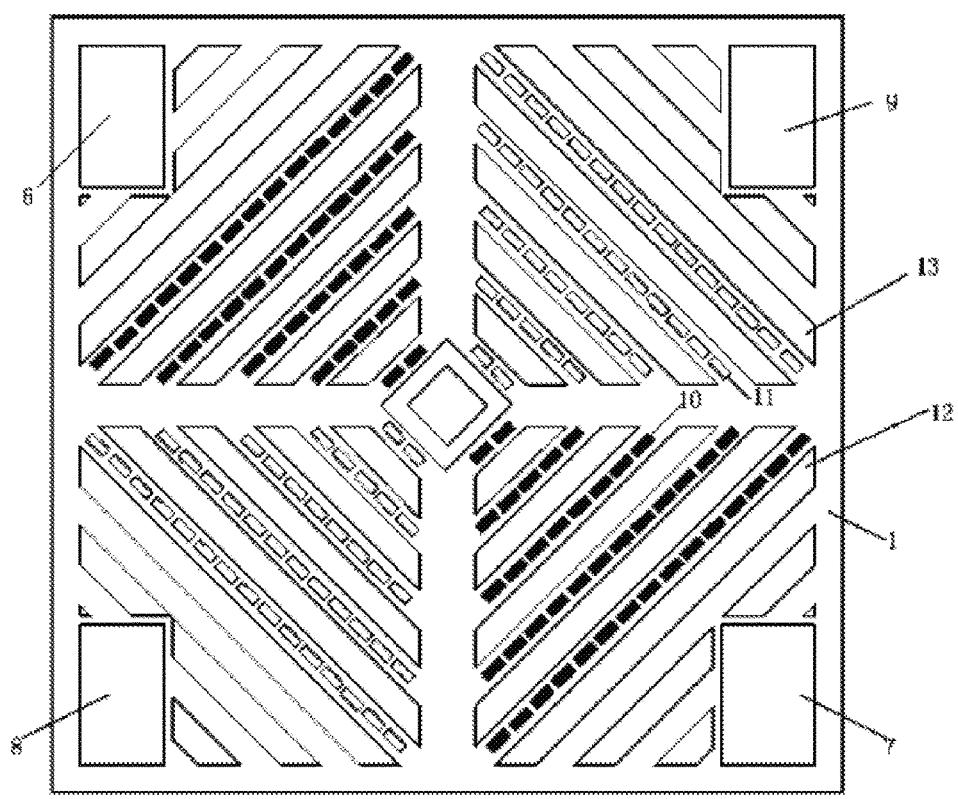
FIG. 3 is another schematic structural view of the single chip push-pull full-bridge magnetic field sensor according to the present invention.

FIG. 3 is another schematic structural view of the single chip push-pull full-bridge magnetic field sensor according to the present invention. The structure shown in this figure is obtained by rotating the magnetoresistance sensing elements 10 and 11 in FIG. 2 respectively by +45° and −45°, and the structure shown in FIG. 3 is different from that shown in FIG. 2 in that the magnetoresistance sensing elements 10 and 11 are parallel to the push arm flux concentrators 12 and the pull arm flux concentrators 13 respectively.

Compared with the square structure in the prior art, the present invention uses the flux concentrators with the elongated structure, which makes use of the space more effectively, has lower hysteresis, enables the sensor to have good linearity and high sensitivity, and also causes output of the sensor not to easy to reach a saturated state, thereby increasing a working dynamic range of the sensor, and in addition, more magnetoresistance sensing elements can be placed at the clearances, thereby reducing the noise.

Embodiment 2

Figure 4:
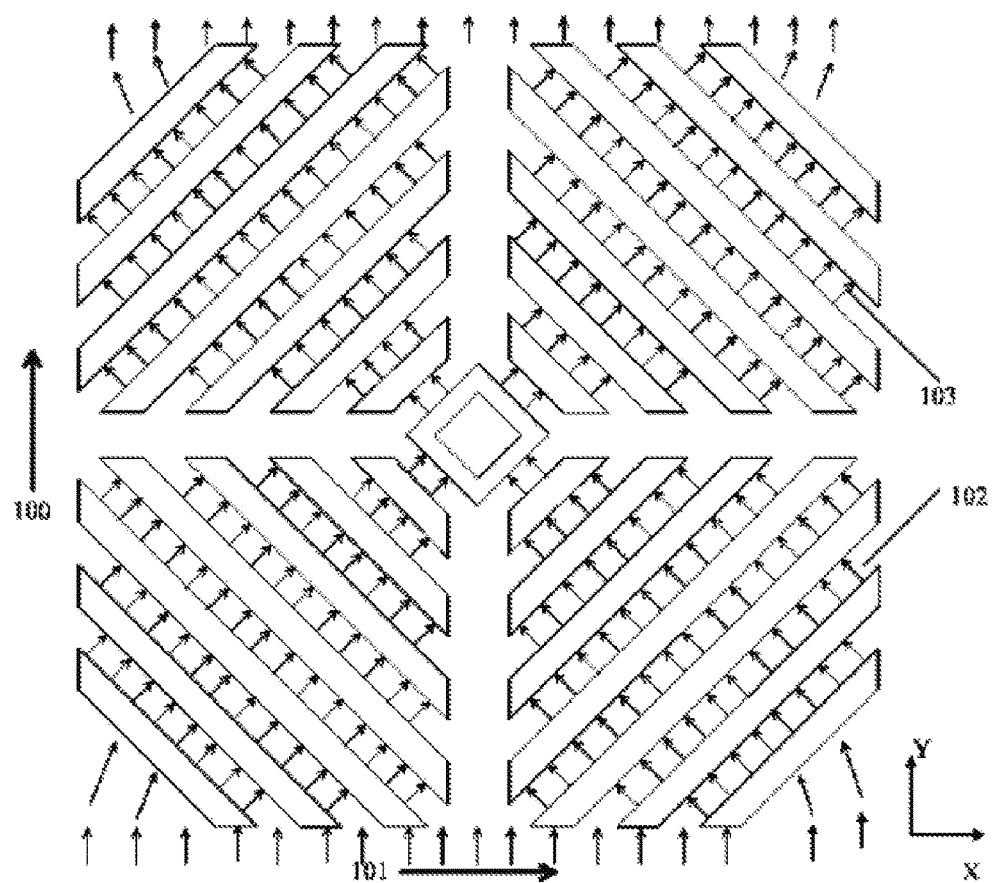
FIG. 4 is a view of the magnetic field distribution of a single chip push-pull full-bridge magnetic field sensor of the present invention in the presence of a Y-axis direction magnetic field.

FIG. 4 is a view of magnetic field distribution of a single chip push-pull full-bridge magnetic field sensor in a Y-axis direction magnetic field according to the present invention. In this figure, the direction 100 of the external magnetic field is parallel to the Y axis, and the measurement direction 101 is parallel to the X axis. It can be seen from this figure that the external magnetic field entering into the sensor is biased by the push arm flux concentrators 12 and the pull arm flux concentrators 13, wherein the magnetic field direction at the clearance 14 between the push arm flux concentrators 12 is 102, and the magnetic field direction at the clearance 15 between the pull arm flux concentrators 13 is 103. The magnetic field directions 102 and 103 are symmetric about the Y axis. In this embodiment, the external magnetic field By=100 G, the magnitudes of the X-axis magnetic field measured are $B_{X+}$=90 G and $B_{X-}$=−90 G, and the gain coefficient is Axy=Bx/By=($B_{x+}$−$B_{x-}$)/By=180/100=1.8, this is greater than the gain coefficient of the single chip reference bridge-type magnetic field sensor in the prior art, and the obtained gain coefficient is relevant to the size of the push arm flux concentrators 12 and the pull arm flux concentrators 13 and the size of the clearances.

Figure 5:
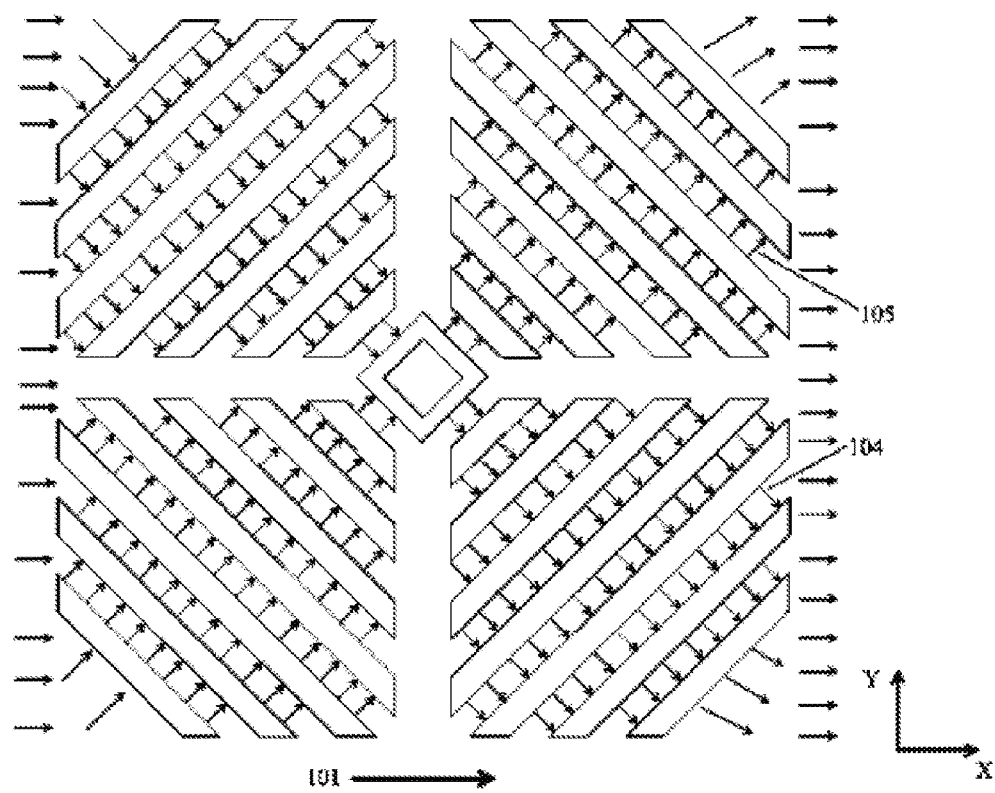
FIG. 5 is a view of magnetic field distribution of the single chip push-pull full-bridge magnetic field sensor of the present invention in the presence of an X-axis direction magnetic field.

FIG. 5 is a view of magnetic field distribution of the single chip push-pull full-bridge magnetic field sensor in an X-axis direction magnetic field according to the present invention. In this figure, both the direction of the external magnetic field and the measurement direction are the direction 101 parallel to the X axis. The magnetic field direction at the clearance 14 between the push arm flux concentrators 12 is 104, and the magnetic field direction at the clearance 15 between the pull arm flux concentrators 13 is 105. The magnetic field directions 104 and 105 are symmetric about the X axis. In this embodiment, the external magnetic field Bx=100 G, the magnitudes of the X-axis magnetic field measured are $B_{X+}$=101 G and $B_{X-}$=−101 G, and the gain coefficient is Axx=($B_{x+}$−$B_{x-}$)/Bx=(101−101)/100=0, and it is thus clear that components of the magnetic field on the two bridge arms in the X axis cancel each other out and it is impossible to detect X-axis magnetic field signals.

Figure 6:
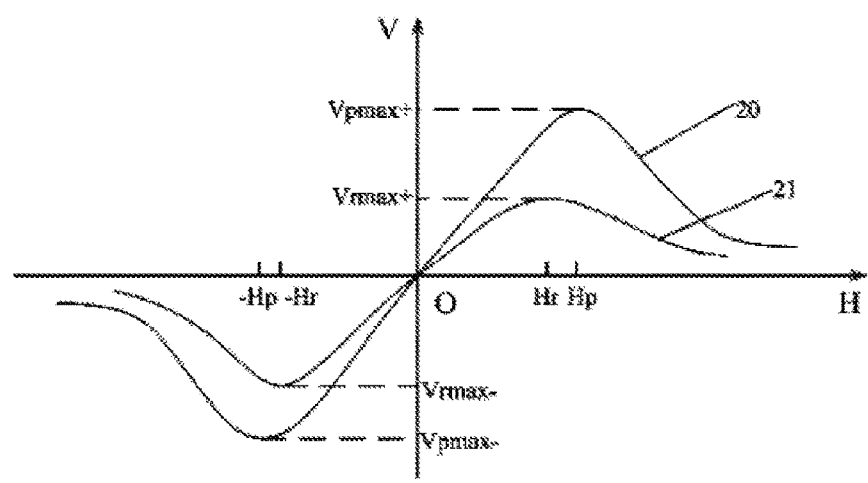
FIG. 6 illustrates response curves of the single chip push-pull full-bridge magnetic field sensor according to the present invention and a single chip referenced bridge-type magnetic field sensor.

FIG. 6 illustrates response curves of the single chip push-pull full-bridge magnetic field sensor according to the present invention and a single chip reference bridge-type magnetic field sensor. A curve 20 is the response curve of the single chip push-pull full-bridge magnetic field sensor according to the present invention, and a curve 21 is the response curve of the single chip reference bridge-type magnetic field sensor. It can be seen from this figure that the curve 20 is symmetric about the origin, while the curve 21 is not symmetric, which limits a linear range of the sensor. In addition, the single chip push-pull full-bridge magnetic field sensor according to the present invention has better linearity, higher detected signal strength, higher sensitivity and a wider dynamic working range.

Embodiment 3

Figure 7:
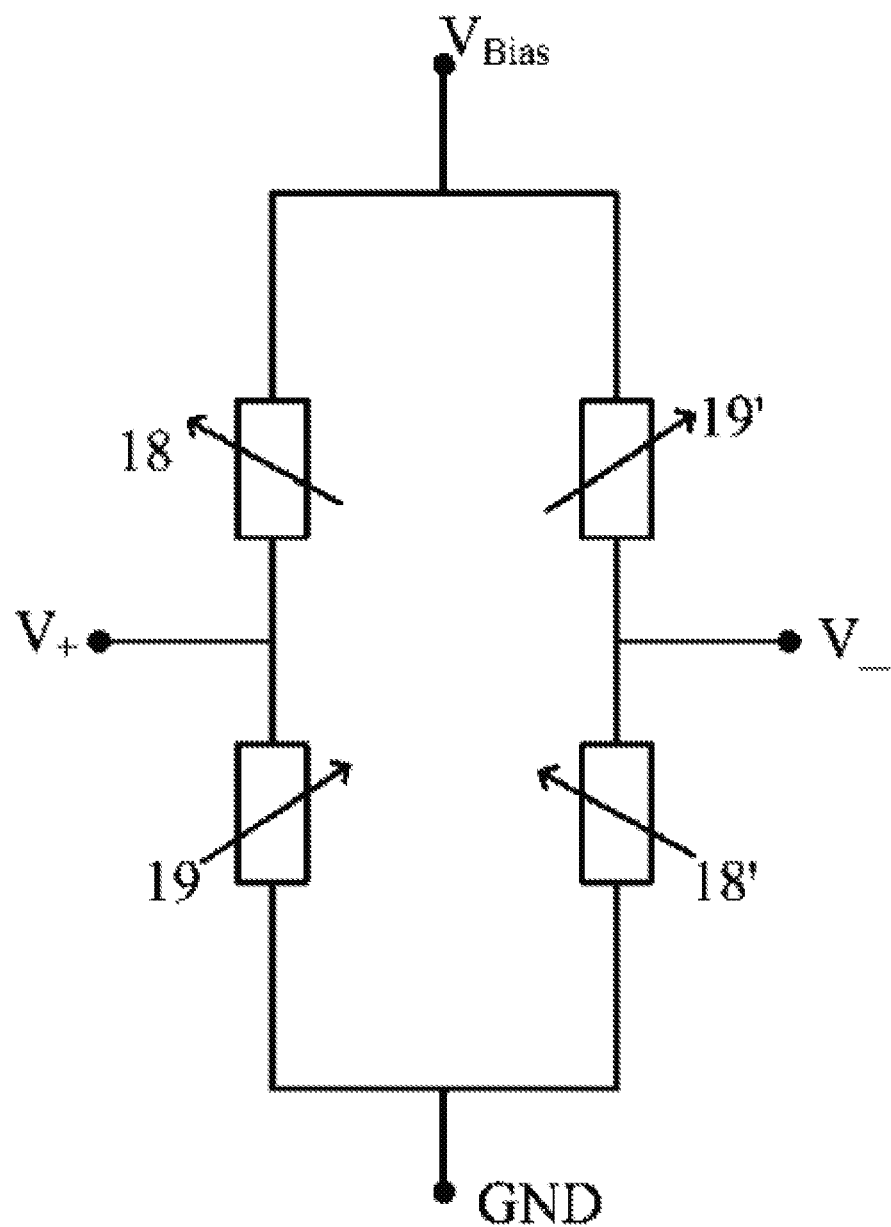
FIG. 7 is a full-bridge circuit diagram of the present invention.

FIG. 7 is a schematic circuit diagram of the single chip push-pull full-bridge magnetic field sensor according to the present invention. Several magnetoresistance sensing elements 10 are electrically connected to form equivalent magnetic resistors R18 and R18', several magnetoresistance sensing elements 11 are electrically connected to form equivalent magnetic resistors R19 and R19', and the four magnetic resistors are connected to form a full bridge. Magnetization directions of their magnetic pinning layers are the same, magnetization directions of magnetic free layers of the magnetic resistors in relative positions (R18 and R18', R19 and R19') are the same, and magnetization directions of magnetic free layers of the magnetic resistors in adjacent positions (R18 and R19, R18 and R19', R18' and R19, R18' and R19') are different. When an external magnetic field is applied along a sensitive direction of the magnetoresistance sensing elements 10 and 11, changes of resistances of the magnetic resistors R18 and R18' may be opposite to those of the magnetic resistors R19 and R19', thereby forming push-pull output. The output voltage of the full bridge is $$V = V_+ - V_- = \frac{R19}{R18+R19}V_{Bias} - \frac{R18'}{R18'+R19'}V_{Bias}$$

Under normal circumstances, R18=R18', R19=R19', and the above formula may be simplified as:

$$V = V_+ - V_- = \frac{R19-R18}{R18+R19}V_{Bias}$$

Figure 8:
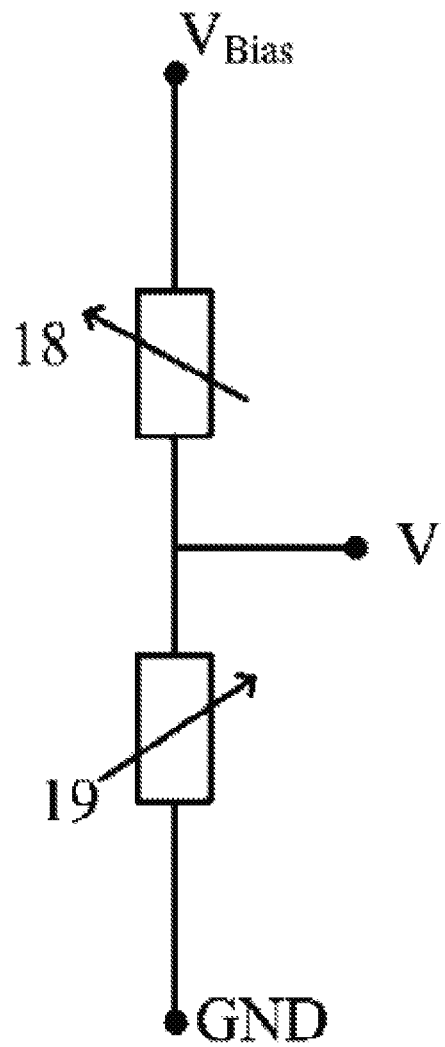
FIG. 8 is a half-bridge circuit diagram of the present invention.
Figure 9:
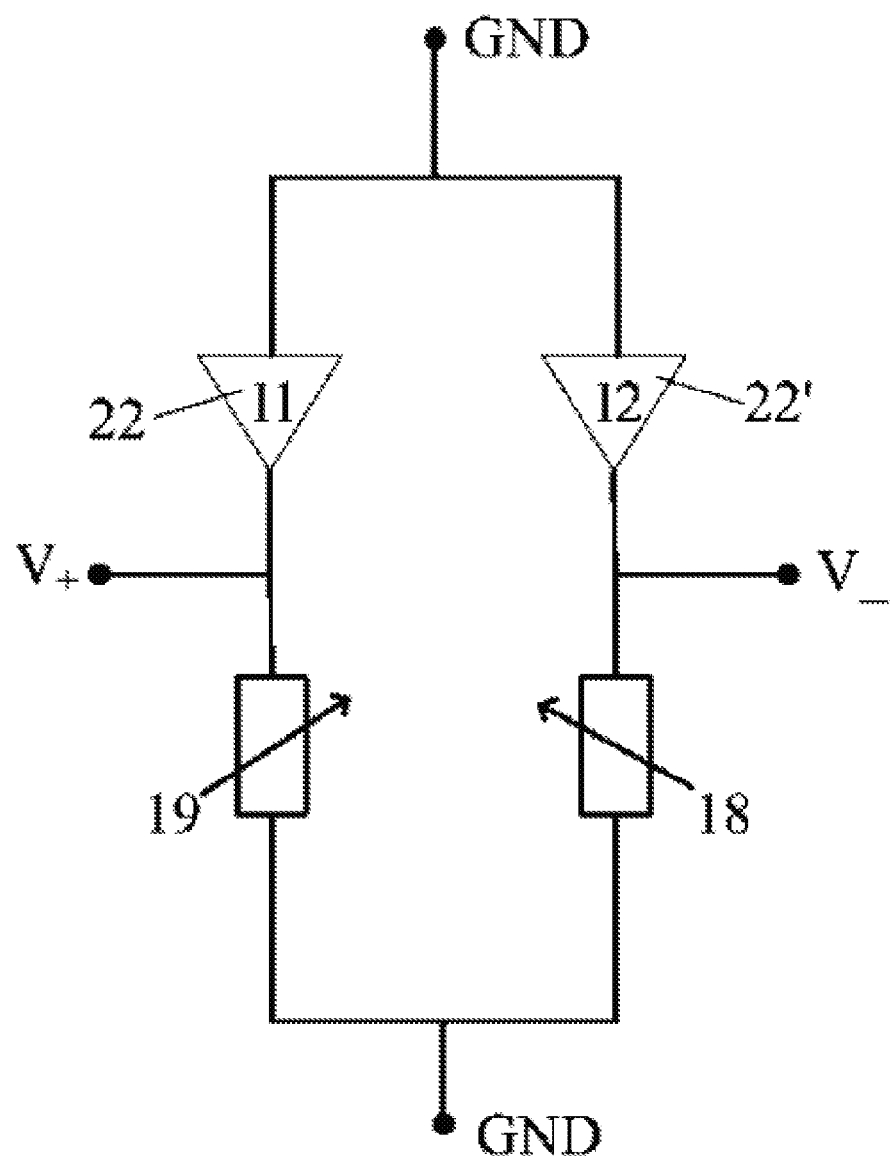
FIG. 9 is a quasi-bridge circuit diagram of the present invention.

The push-pull bridge in the present invention may also be a half bridge or a quasi bridge, and schematic circuit diagrams of such two structures are as shown in FIG. 8 and FIG. 9 respectively. The working principle of the two structures is the same as that of the full bridge, wherein the output voltage of the sensor of the full-bridge structure is $$V = \frac{R19}{R18+R19}V_{Bias}$$

The sensor of the quasi-bridge structure further includes two identical current sources I1 22 and I2 22', magnitudes of the two current sources are equal, both of which are $I_{Bias}$, and the output voltage of the sensor of the structure is $$V=V_+-V_-=(R19-R18)I_{Bias}$$

The above descriptions are merely preferred embodiments of the present invention, but are not intended to limit the present invention. For persons skilled in the art, the present invention may have various modifications and changes. Any modification, equivalent replacement, improvement and the like made within the spirit and principle of the present invention shall be included in the protection scope of the present invention.

The invention claimed is:

1. A single chip push-pull bridge-type magnetic field sensor, comprising:
   a substrate in an XY plane, wherein the XY plane is defined by coordinate axes, an X axis and a Y axis;
   at least one push arm consisting of one or more magnetoresistance sensing elements;
   at least one pull arm consisting of one or more magnetoresistance sensing elements;
   multiple push arm flux concentrators and pull arm flux concentrators disposed on the substrate, and certain clearances are provided between every two of the multiple push arm flux concentrators and between every two of the multiple pull arm flux concentrators, wherein an included angle between the push arm flux concentrators and the X-axis forward direction is positive while an included angle between the pull arm flux concentrators and the X-axis forward direction is negative, or an included angle between the push arm flux concentrators and an X-axis forward direction is negative while an included angle between the pull arm flux concentrators and the X-axis forward direction is positive;
   magnetization directions of magnetic pinning layers of the magnetoresistance sensing elements are identical;
   the magnetoresistance sensing elements are respectively located at the clearances between two adjacent push arm flux concentrators or two adjacent pull arm flux concentrators correspondingly, to detect a difference value of components of magnetic fields between the push arm flux concentrators and the pull arm flux concentrators in the direction of the X axis; and a microelectronic electrical connection and packaging method is used to interconnect the magnetoresistance sensing elements into a push-pull bridge and form input and output connections.

2. The single chip push-pull bridge-type magnetic field sensor according to claim 1, wherein the magnetoresistance sensing elements are GMR or TMR sensing elements.

3. The single chip push-pull bridge-type magnetic field sensor according to claim 1, wherein, in the absence of an external magnetic field, the magnetoresistance sensing elements magnetization directions are perpendicular to the magnetization directions of the magnetic pinning layers through the use of permanent magnet biasing, double exchange interaction, shape anisotropy, or any combination thereof.

4. The single chip push-pull bridge-type magnetic field sensor according to claim 1, wherein the number of the magnetoresistance sensing elements on the push arm and the pull arm are the same and the magnetoresistance sensing elements in relative positions of the push arm and the pull arm are parallel to each other.

5. The single chip push-pull bridge-type magnetic field sensor according to claim 1, wherein rotational angles of the magnetoresistance sensing elements on the push arm and the pull arm are at the same magnitude but opposite polarity.

6. The single chip push-pull bridge-type magnetic field sensor according to claim 1, wherein the included angle between the push arm flux concentrators and the X-axis forward direction is 5° to 85°, and the included angle between the pull arm flux concentrators and the X-axis forward direction is −5° to −85°.

7. The single chip push-pull bridge-type magnetic field sensor according to claim 1, wherein the push-pull bridge is a half bridge, a full bridge, or a quasi bridge.

8. The single chip push-pull bridge-type magnetic field sensor according to claim 1, wherein both the push arm flux concentrators and the pull arm flux concentrators are comprised of arrays of elongated bars, which are made of a material selected from a soft ferromagnetic alloy consisting of one or more elements of Ni, Fe, Co and Al.

9. The single chip push-pull bridge-type magnetic field sensor according to claim 1, wherein the number of the push arm flux concentrators and the number of the pull arm flux concentrators are the same.

10. The single chip push-pull bridge-type magnetic field sensor according to claim 1, wherein the microelectronic connection and packaging method comprises bonding pads, a lead frame, flip chip, ball grid array, wafer level packaging, or chip on board direct mounting.

* * * * *

UNITED STATES PATENT AND TRADEMARK OFFICE
CERTIFICATE OF CORRECTION

PATENT NO. : 9,702,943 B2
APPLICATION NO. : 14/908770
DATED : July 11, 2017
INVENTOR(S) : James Geza Deak Page 1 of 1

It is certified that error appears in the above-identified patent and that said Letters Patent is hereby corrected as shown below:

On the Title Page

Item (87), in "PCT Pub. Date", in Column 1, Line 1, delete "May 2, 2015" and insert --Feb. 5, 2015-- therefor Item (30), in "Foreign Application Priority Data", in Column 1, Line 1, delete "201310325337" and insert --201310325337.5-- therefor Signed and Sealed this
Seventeenth Day of April, 2018

Andrei Iancu
*Director of the United States Patent and Trademark Office*